US008689155B1

(12) United States Patent
Galpin

(10) Patent No.: US 8,689,155 B1
(45) Date of Patent: Apr. 1, 2014

(54) METHOD OF PROVING FORMAL TEST BENCH FAULT DETECTION COVERAGE

(71) Applicant: Infineon Technologies AG, Neubiberg (DE)

(72) Inventor: Darren Galpin, Bristol (GB)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/626,249

(22) Filed: Sep. 25, 2012

(51) Int. Cl.
*G06F 17/50* (2006.01)
(52) U.S. Cl.
USPC ........... 716/106; 716/101; 716/107; 716/110; 716/111
(58) Field of Classification Search
USPC .......................... 716/101, 106, 107, 110, 111
See application file for complete search history.

(56) References Cited

U.S. PATENT DOCUMENTS

| | | | | |
|---|---|---|---|---|
| 5,282,146 A * | 1/1994 | Aihara et al. | ................. | 716/106 |
| 5,557,774 A * | 9/1996 | Shimabukuro et al. | ......... | 703/21 |
| 6,477,683 B1 * | 11/2002 | Killian et al. | ................. | 716/106 |
| 7,889,019 B2 * | 2/2011 | Gizara | ........................... | 332/109 |
| 2003/0167274 A1 * | 9/2003 | Dettinger et al. | ............. | 707/100 |
| 2005/0075996 A1 * | 4/2005 | Dettinger et al. | ................. | 707/1 |
| 2005/0076316 A1 * | 4/2005 | Pierrat et al. | ....................... | 716/4 |

OTHER PUBLICATIONS

"Certitude User Manual", SpringSoft, Inc.; Taipei, Taiwan and San Jose, California; www.softspring.com; Oct. 22, 2010, p. 1-214.

* cited by examiner

*Primary Examiner* — Sun Lin
(74) *Attorney, Agent, or Firm* — Eschweiler & Associates, LLC

(57) ABSTRACT

Some aspects of the present disclosure provide for a system and method to discover which parts of a design a formal test suite can detect faults in, and thus how much of a design structure is covered by a property set. A mutatable RTL design is defined which allows for modification of a part of an RTL design from its intended behavior to a non-intended behavior, thus introducing unwanted effects. The mutatable RTL design can then be synthesized to produce a functional representation of the design. The property set can be re-run on the synthesized design to see whether the functional representation of the design is sensitive to the unwanted effect and thus whether formal verification can detect the modification.

20 Claims, 8 Drawing Sheets

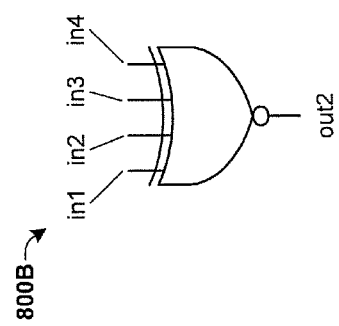
Fig. 8C
| | in1 | in2 | in3 | in4 | out1 | out2 |
|---|---|---|---|---|---|---|
| vector1 | 0 | 0 | 0 | 0 | 0 | 1 |
| vector2 | 0 | 0 | 0 | 1 | 1 | 1 |
| vector3 | 0 | 0 | 1 | 0 | 1 | 1 |
| vector4 | 0 | 0 | 1 | 1 | 0 | 1 |
| vector5 | 0 | 1 | 0 | 0 | 1 | 0 |
| vector6 | 0 | 1 | 0 | 1 | 0 | 0 |
| vector7 | 0 | 1 | 1 | 0 | 0 | 0 |
| vector8 | 0 | 1 | 1 | 1 | 1 | 0 |
| vector9 | 1 | 0 | 0 | 0 | 0 | 0 |
| vector10 | 1 | 0 | 0 | 1 | 0 | 0 |
| vector11 | 1 | 0 | 1 | 0 | 0 | 0 |
| vector12 | 1 | 0 | 1 | 1 | 0 | 1 |
| vector13 | 1 | 1 | 0 | 0 | 0 | 1 |
| vector14 | 1 | 1 | 0 | 1 | 0 | 1 |
| vector15 | 1 | 1 | 1 | 0 | 0 | 1 |
| vector16 | 1 | 1 | 1 | 1 | 0 | 1 |
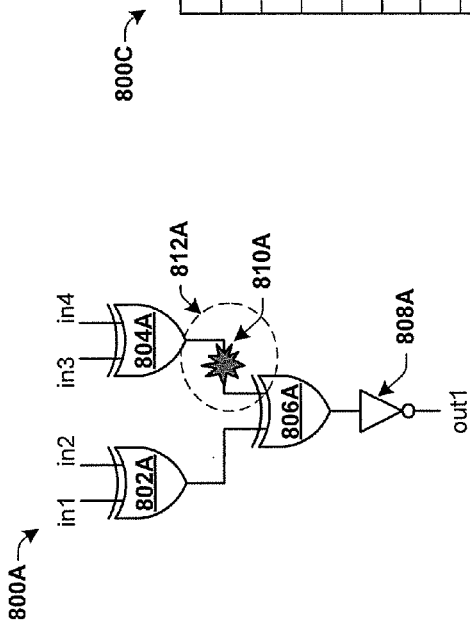
Fig. 8A
Fig. 8B

US 8,689,155 B1

METHOD OF PROVING FORMAL TEST BENCH FAULT DETECTION COVERAGE

BACKGROUND

State of the art formal verification methods do not yield coverage metrics which provide a quantitative measurement of how much of a register transfer level (RTL) design has been exercised during verification. Properties can be gauged for completeness to determine if all outputs of a design have been tested over all possible input conditions. However, there is no analogous metric to provide a statement of structural coverage to determine if all of the lines of a hardware description language (HDL) representation of an RTL design have been executed during operation. Such a metric would be directly comparable to simulation metrics to provide a statement of structural coverage.

SUMMARY

The following presents a simplified summary in order to provide a basic understanding of one or more aspects of the disclosure. This summary presents one or more concepts of the disclosure in a simplified form as a prelude to the more detailed description that is presented later and is not an extensive overview of the disclosure. In this regard, the summary is not intended to identify key or critical elements of the disclosure, nor does the summary delineate the scope of the disclosure.

The present disclosure relates to a method and processing unit to determine test coverage by a plurality of test vectors of an application-specific integrated circuit (ASIC). Prior to manufacturing, the ASIC is modeled at the register transfer level (RTL) level of abstraction with hardware description language (HDL) code. This disclosure introduces a control vector into the HDL code. The control vector is configured to modify segments of the HDL code to mimic faults which can occur when the ASIC is manufactured. The HDL code is then simulated against the plurality of test vectors to determine if the fault is detected.

BRIEF DESCRIPTION OF THE DRAWINGS

FIGS. 8A-8C illustrate some embodiments of simulation versus formal verification.

DETAILED DESCRIPTION

Figure 1:
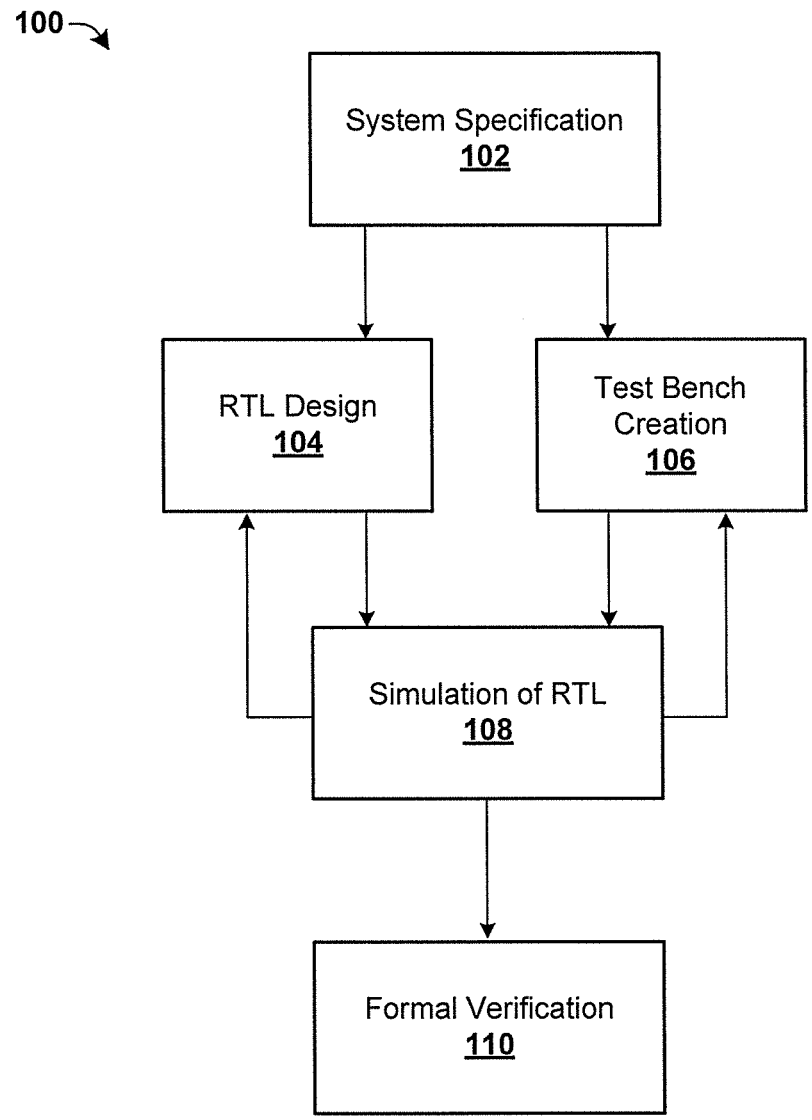
FIG. 1 illustrates a design to verification flow for an application-specific integrated circuit (ASIC).

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

FIG. 1 illustrates a design to verification flow 100 for an application-specific integrated circuit (ASIC). First, a high-level system specification 102 is established defining the major components and interactions of the ASIC. Second, a hardware description language (HDL) (e.g., VHDL or Verilog) is used to define aspects of a processor system architecture of the ASIC system at the register transfer level (RTL) level of abstraction, or RTL design 104. RTL is a design abstraction which models logic components of the ASIC in terms of hardware registers which synchronize logic component operation. This is a higher level abstraction for ASIC definition than the transistor level, wherein every device is modeled, or at the gate level, wherein sub-devices (e.g., source, drain, gate, contacts, etc.) are modeled. The transistor level of abstraction and gate level of abstraction provide more modeling accuracy, but are computationally impractical for most ASIC applications. Simultaneous to the RTL design 104, a test bench suite 106 is created comprising a comprehensive set of test stimuli, or test cases, to verify operation of the RTL design 104 per the high-level system specification 102. Next, the RTL design 104 is simulated 108 to validate the functionality of the test bench suite 106 against the high-level system specification 102. Finally, the RTL design 104 is synthesized to produce a physical system architecture comprising a functional representation of the design for formal verification 110. The functional representation of the design may be at the transistor level or gate level of the design, and describes the function and interaction of the various components of the ASIC (e.g., an extracted netlist).

Formal verification 110 relies on mathematically proving that a certain behavior which can be described in Boolean logic holds on a Boolean logic representation of the design. Formal verification 110 also relies on a formal verification tool to synthesize the RTL design 104 into a Boolean representation, and to use mathematical techniques to reduce the size of the design using logical equivalence techniques and other mathematical methods. The formal tool then takes the behavior described (i.e., a property), and mathematically proves that the property either holds or fails on the design representation, implicitly trying all possible input combinations to the design. The mathematical reduction of the Boolean representation of the design creates a representation of the RTL design, rather than the RTL design itself, wherein some structural information about the design may be lost. As a consequence, it is not possible to get statement coverage of functional aspects of the RTL design 104 directly from a proof, given that all possible input stimuli have been tried, which is the equivalent to simulating all possible vector combinations on the reduced design.

Accordingly, some aspects of the present disclosure provide for a system and method to discover which parts of a design a formal test suite can detect faults in, and thus how much of a design structure is covered by a property set. A mutatable RTL design is defined which allows for modification of a part of an RTL design from its intended behavior to a non-intended behavior, thus introducing unwanted effects. The mutatable RTL design can then be synthesized to produce a functional representation of the design. The property set can be re-run on the synthesized design to see whether the functional representation of the design is sensitive to the unwanted effect and thus whether formal verification can detect the modification.

Figure 2:
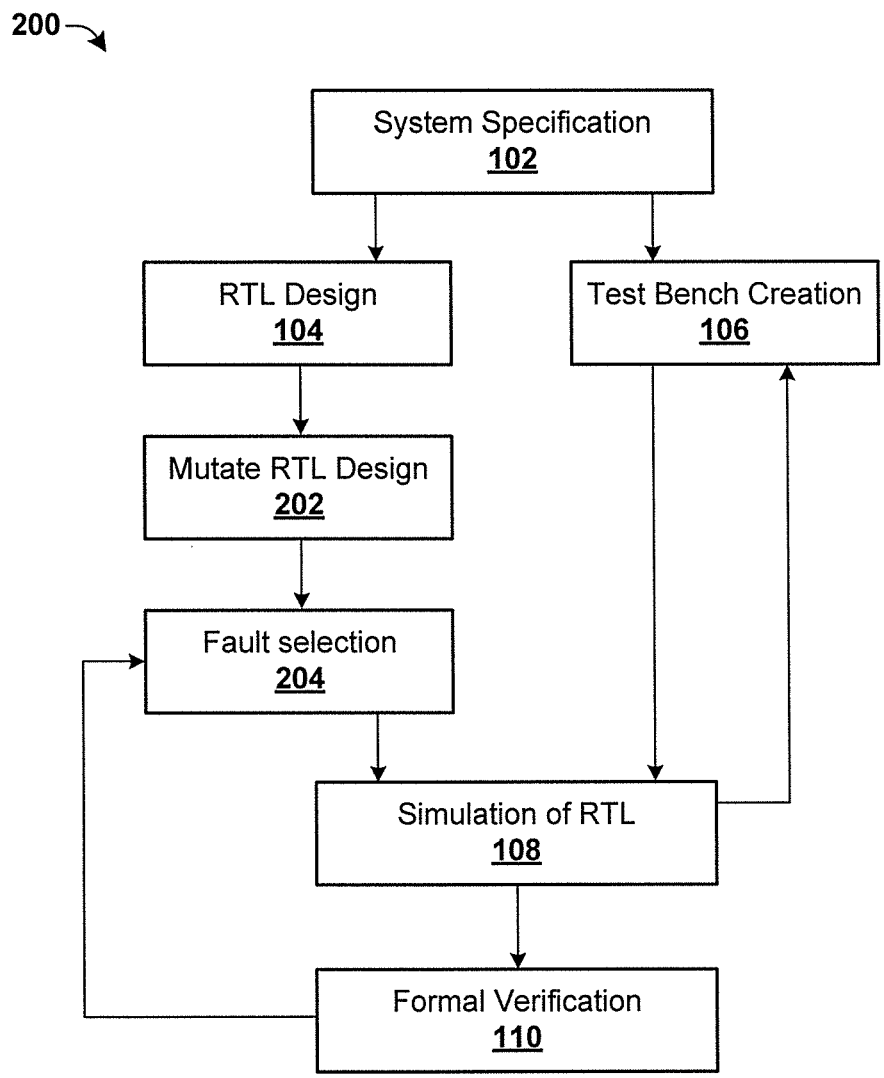
FIG. 2 illustrates some embodiments of a design to verification flow for a mutatable ASIC.

FIG. 2 illustrates some embodiments of a design to verification flow 200 for a mutatable ASIC. A high-level system specification 102 is established and defined as an RTL abstraction (or RTL design) 104 in HDL. A mutatable RTL design 202 is defined by augmenting the RTL design 104, allowing for modification of one or more components of the RTL design 104. A respective component of the mutatable RTL design 202 is modified by selecting a fault 204 to be introduced into the mutatable RTL design 202. For example, a signal X may be assigned with signal Y, modifying the code so that it is now assigned 0 at all times, or changing an AND operation to an OR operation. Simultaneous to defining the mutatable RTL design 202, a test bench suite 106 is created comprising a comprehensive set of test cases to verify operation of the ASIC.

The mutatable RTL design 202 is simulated 108 to validate the functionality of the test cases against the high-level system specification 102, specifically to determine if selection of the fault 204 is detected. The mutatable RTL design 202 is then synthesized to produce a Boolean logic representation of the mutatable RTL design 202 during formal verification 110, to determine if selection of the fault 204 is detected. If selection of the fault 204 is detected in formal verification 110, then the structure associated with the fault is covered in the test bench suite.

Figure 3:
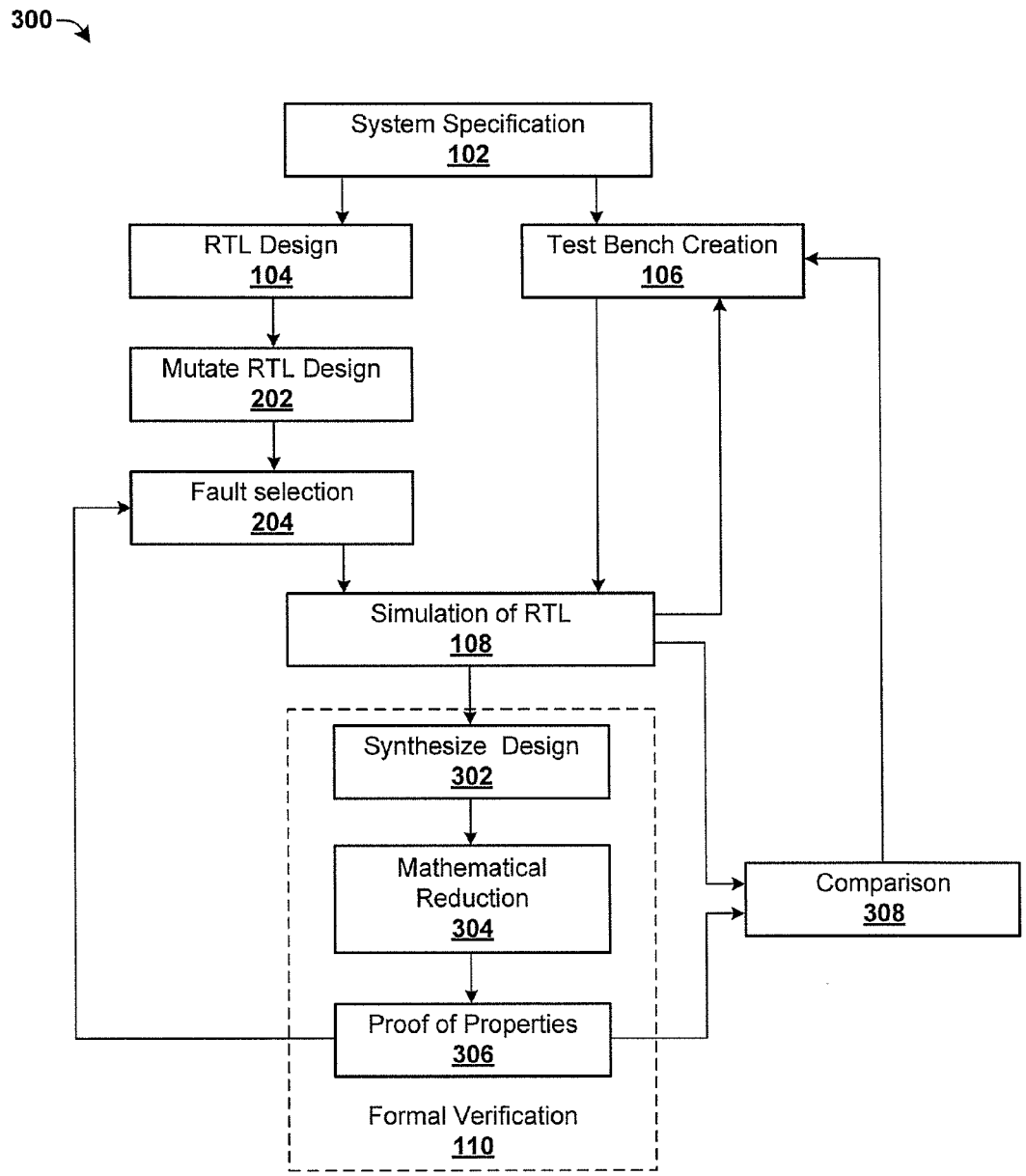
FIG. 3 illustrates some embodiments of a design to verification flow for a mutatable ASIC for determining structural coverage.

FIG. 3 illustrates some embodiments of a design to verification flow 300 for a mutatable ASIC for determining structural coverage. A high-level system specification 102 and associated abstract representation as an RTL design 104 is defined in HDL code. A mutatable RTL design 202 is defined by augmenting the RTL design 104 with a control vector configured to modify one or more components of the RTL design 104 (e.g., modifying various segments of HDL code). The control vector is enabled to modify a respective component of the mutatable RTL design 202, selecting a fault 204 to introduce into the mutatable RTL design 202. The mutatable RTL design 202 is simulated 108 to validate the functionality of test cases created in the test bench suite 106 to determine if selection of the fault 204 is detected. The mutatable RTL design 202 is then synthesized 302 during formal verification 110, producing a Boolean logic representation of the mutatable RTL design 202.

Formal verification further 110 comprises a mathematical reduction 304 of the Boolean logic representation of the mutatable RTL design 202 through logical equivalence techniques and other mathematical methods. A proof of properties 306 is then performed, mathematically proving that a property holds for the Boolean logic representation of the design synthesized from the mutatable RTL design 202, to determine if selection of the fault 204 is detected. This process may be repeated for various components (e.g., modifying various segments of a line of HDL code) by iteratively modifying each component of the mutatable RTL design 202 one at a time, leaving remaining components unmodified, synthesizing the mutatable RTL design 202 into a plurality of Boolean logic representations of the design, one for each modified component, and mathematically proving that a set of properties hold for each respective Boolean logic representation of the design by a proof of properties 306. A formal comparison 308 may then be made between results of simulation 108 and results of the proof of properties 306 for each respective Boolean logic representation of the design to determine which component modifications are not detected by the proof of properties 306, to further determine which components of the RTL design 104 are not covered in formal verification 110. The test bench suite 106 may then be refined to provide additional coverage.

Figure 4:
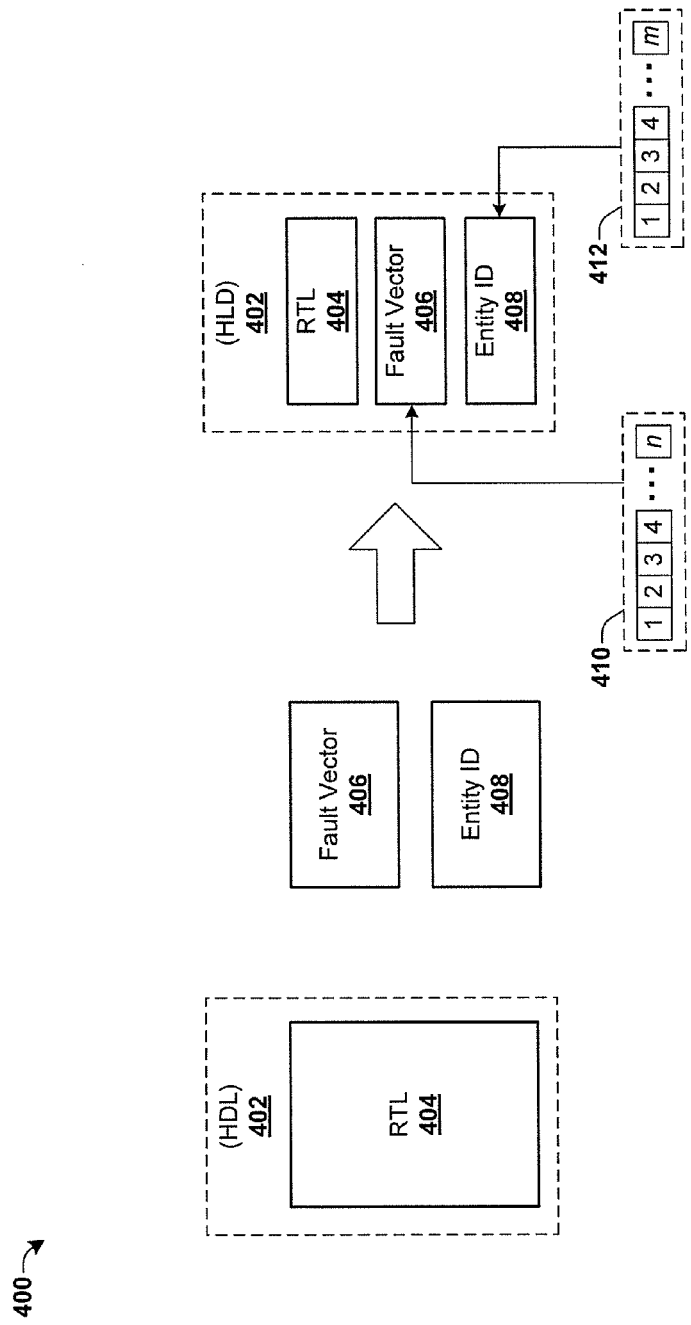
FIG. 4 illustrates some embodiments of a control vector configured to modify one or more components of an HDL system architecture.

FIG. 4 illustrates some embodiments of a control vector 410 configured to modify one or more components of a component of an HDL system architecture 400. An RTL design 404 is represented in HDL code 402. A first feature configured to modify a respective component of the RTL design 404 is defined. The first feature comprises a fault identification instrumentation 406 of the RTL design 404, which utilizes the control vector 410 configured to modify various segments of the HDL code 402, a respective segment of HDL code 402 comprising a component of the design. A second feature comprising an entity identification instrumentation 408 of the RTL design 404 is also defined, which utilizes a location vector 412 configured to identify a sub-module of the design comprising one or more components, and to identify all respective components within the sub-module. The RTL design 404 is then augmented with the fault identification instrumentation 406 and the entity identification instrumentation 408.

For the embodiments of the HDL system architecture 400, the control vector 410 comprises a binary vector comprising a number of n bits that is equal to a number of components of the RTL design 404, wherein a respective component comprises one or more devices, or a portion of a device (e.g., a transistor, collection of transistors, or sub-device such as gate, source, drain, or contact). The n bits of the control vector are configured to be modified such that a bit value of zero leaves a corresponding component unaffected, and a bit value of non-zero modifies the corresponding component. A component of the design is modified by introducing a fault into the component, wherein the fault models an effect of a manufacturing defect to the component, and the effect of a manufacturing defect on the component is to produce an output that is not anticipated from an input. Similarly, the location vector 412 comprises a binary vector comprising m bits that is equal to a number of sub-modules of the RTL design 404. In a preferred embodiment the location vector 412 is contained within the control vector 410.

If design mutations are disabled (i.e., the control vector 410 is driven to disable all of the faults by setting all n bits equal to zero), then the synthesized design works as specified. If a mutation is enabled by driving one of the n bits of the control vector 410 to 1, then faults can be injected into the RTL design 404 to mimic stuck at faults, incorrect gate logic (e.g., an AND rather than an OR) and other such faults. The property set is then re-run on the synthesized design with the mutation enabled. If the property set fails, then the mutation has been detected and the property set can find the fault.

The same mutations can be injected into the RTL design 404 which is simulated, and the simulation test bench is then run to see whether the simulation based tests detect the fault. Thus the results from the formal run and the coverage obtained can then be compared to the same coverage obtained during simulation, and thus a combined coverage figure for the whole verification approach obtained. The advantage of this approach is that it is automated, and provides an objective measure of coverage which can be compared and merged between formal and simulation based verification.

Figure 5:
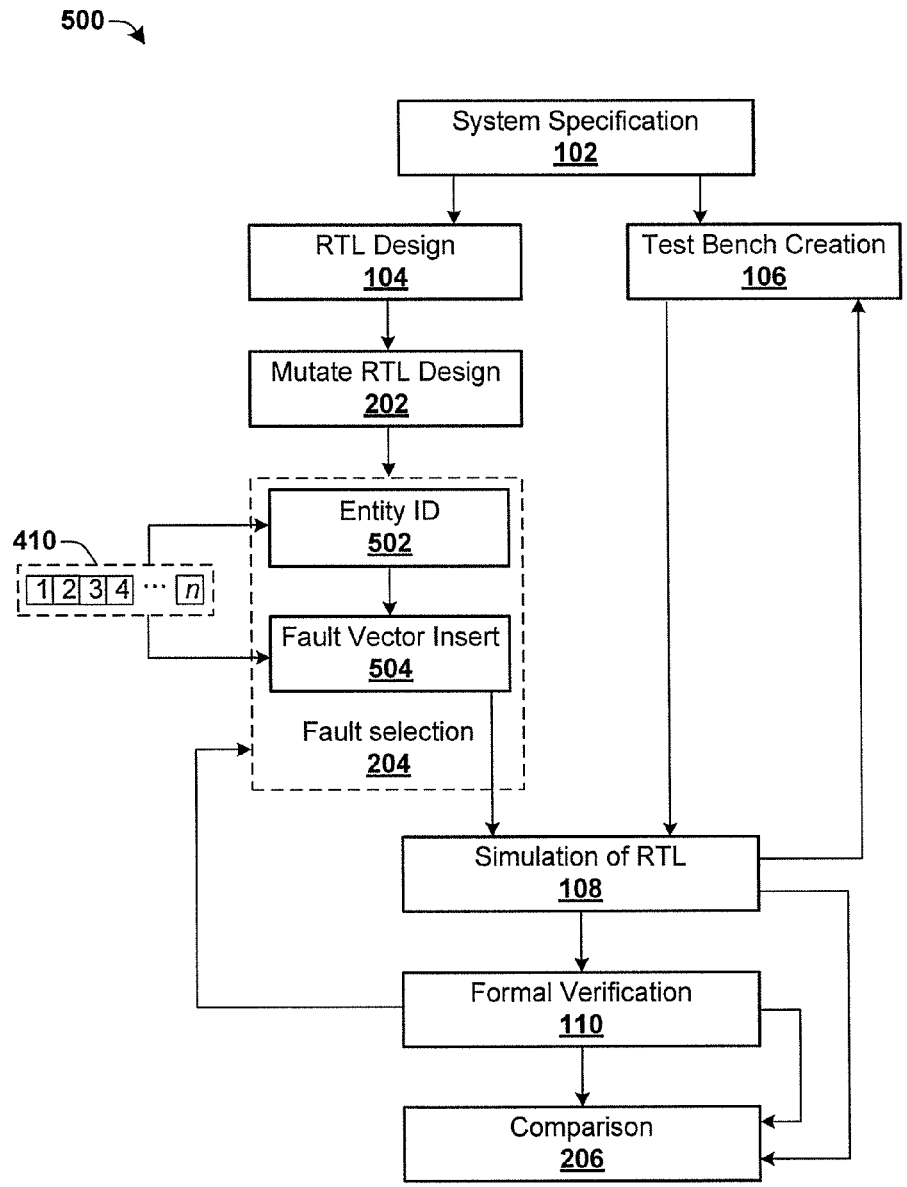
FIG. 5 illustrates some embodiments of a design to verification flow for a mutatable ASIC which is modified by a control vector.

FIG. 5 illustrates some embodiments of a design to verification flow 500 for a mutatable ASIC which is modified by a control vector 410. A mutatable RTL design 202 is defined by augmenting the RTL design 104 with a control vector 410 configured to modify one or more components of the RTL design 104. The control vector 410 comprises a binary vector comprising n bits that is equal to a number of components of the mutatable RTL design 202, which are configured to modify a respective component of the mutatable RTL design 202 when an associated respective bit is set to non-zero, introducing a fault into the respective component 504. In some embodiments the control vector 410 is configured to identify a sub-module of the mutatable RTL design 202 comprising one or more components 502, prior to identifying a respective component 504 within the sub-module. The mutatable RTL design 202 is then simulated 108, and synthesized for formal verification 110 to determine if the fault to the respective component 504 is detected.

Figure 6:
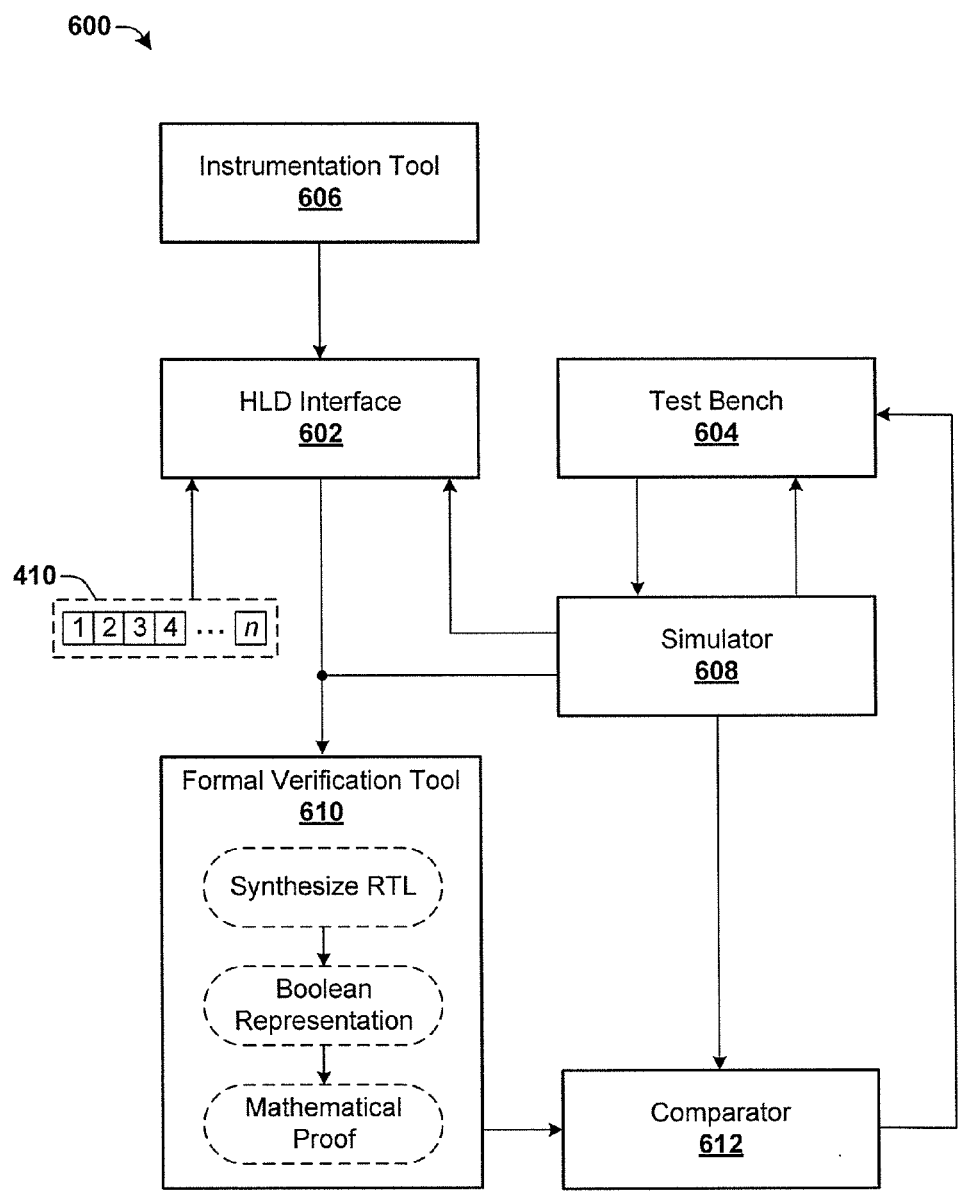
FIG. 6 illustrates some embodiments of a processing unit configured to determine test coverage of a design.

FIG. 6 illustrates some embodiments of a processing unit configured to determine test coverage of a design comprising an HLD interface 602, a test bench 604, an instrumentation tool 606, a simulator 608, a formal verification tool 610, and a comparator 612. The HLD interface 602 is configured to define an ASIC system architecture at the RTL level abstraction (i.e., RTL design). The test bench 604 is configured to define a test suite comprising a plurality of test cases configured to test functionality of the RTL design against a system specification. The simulator 608 is configured to simulate the plurality of test cases against the RTL design to verify functionality against the system specification.

The instrumentation tool 606 is configured to modify an RTL design coded within the HLD interface 602, augmenting the RTL design by instrumenting lines of the HDL code such that a control vector 410 can be injected into the RTL design to alter a segment of the HDL code. The control vector 410 is configured to modify components of the RTL to mimic manufacturing faults. The formal verification tool 610 is configured to synthesize the RTL design into a physical representation of the design comprising a Boolean logic representation of the design, reduce the Boolean logic representation of the design through mathematical equivalencies, and mathematically prove that a property holds for the Boolean logic representation of the design. The comparator 612 is configured to compare results of the simulation of the plurality of test cases against the RTL design to the mathematical proof of one or more properties of the Boolean logic representation of the design to determine if a modification to the RTL design is detected by the mathematical proof of the formal verification tool 610.

Figure 7:
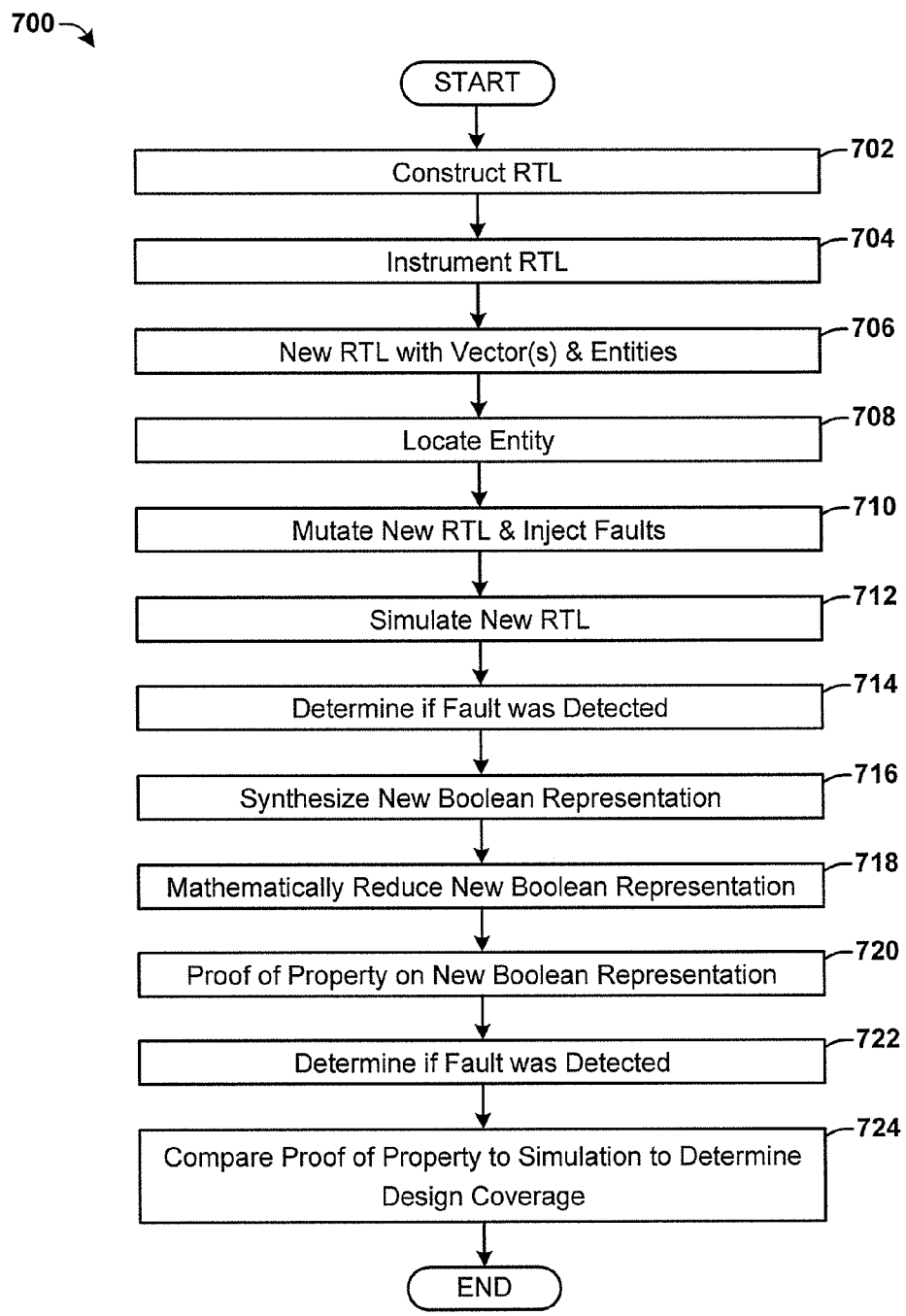
FIG. 7 illustrates some embodiments of a method to determine test coverage of a design.

FIG. 7 illustrates some embodiments of a method 700 to determine test coverage of a design. It will be appreciated that while the method 700 is illustrated and described as a series of acts or events, that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases. Furthermore, the disclosed methods may be implemented as an apparatus, or article of manufacture using standard programming and/or engineering techniques to produce software, firmware, hardware, or any combination thereof to control a computer to implement the disclosed subject matter.

At 702 an HDL representation (e.g., VHDL or Verilog) of a design is constructed based upon a high-level system specification. The HDL representation is used to define aspects of a functioning ASIC system at the register transfer level (RTL) level of abstraction, or RTL design.

At 704 the RTL design is augmented by modifying lines of the HDL code such that a control vector can be injected into the RTL design to modify a segment of the HDL code. The control vector is configured to modify components of the RTL design to mimic manufacturing defects.

At 706 the augmentation of the RTL design in 704 results in a mutatable RTL design, which may be modified by the control vector. The control vector is further configured to identify a sub-module of the mutatable RTL design comprising one or more components, and to identify all respective components within the sub-module.

At 708 a sub-module is identified within the mutatable RTL design containing a component (e.g., a device or sub-device) wherein a manufacturing defect is to be modeled.

At 710 the control vector is configured to adjust a respective bit value from zero to non-zero, wherein the bit value corresponds to the respective component within the sub-module, introducing a fault into the respective component.

At 712 simulation test bench code comprising test cases are simulated against the mutatable RTL design to validate the functionality of the test cases against the high-level system specification.

At 714 the results of the simulation of the test bench code are evaluated to determine if the fault is detected by the simulation.

At 716 the mutatable RTL design is synthesized in a formal verification tool to produce a Boolean logic representation of all or a part of the RTL design.

At 718 the Boolean logic representation is reduced through logical equivalence techniques and other mathematical methods.

At 720 a proof of properties is performed on the reduced Boolean logic representation to mathematically prove that a respective property holds.

At 722 the proof of properties is examined to determine if the fault is detected by the proof of properties.

At 724 a formal comparison is made between results of the simulation in 712 and results of the proof of properties in 720 to determine which component modifications are not detected by the proof of properties. The test bench code may then be refined to provide additional coverage, if desired.

For the purpose of illustrating some embodiments of simulation versus formal verification, the embodiments of FIGS. 8A-8C are examined. FIG. 8A illustrates some embodiments physical system architecture 800A of a 4-to-1 XOR tree coupled to an inverter. The physical system architecture 800A comprises a first XOR gate 802A, a second XOR gate 804A, a third XOR gate 806A, and an inverter 808A in the arrangement shown. Some embodiments of an RTL level of abstraction (i.e., RTL design) of physical system architecture 800A comprises HLD code further comprising three XOR functions configured function on a rising clock edge, wherein a first respective output of a first XOR function corresponding to the first XOR gate 802A, and a second respective output of a second XOR function corresponding to the second XOR gate 804A, form first and second respective inputs to a third XOR function corresponding to the third XOR gate 806A. A third output of the third XOR function forms a third input to an inverter function corresponding to the inverter 808A.

A test suite comprising a plurality of test cases or test vectors configured to test functionality of the RTL design further comprises vector1-vector16 illustrated in the table of FIG. 8C, wherein a respective test case comprises a 4 bit binary vector, a respective bit configured to serve as an input to the HLD code (i.e., in1-in4). A simulation of the RTL design comprises stimulating the HLD code with the test cases bits in columns in1-in4 as inputs to the code, and cataloging the outputs (i.e., out1). For the embodiments of FIG. 8A, the out1 column of the table of FIG. 8C comprises an HLD simulation of a defect-free RTL design of the physical system architecture 800A. Furthermore, for the embodiments of FIG. 8A the out2 column of the table of FIG. 8C comprises an HLD simulation of the RTL design wherein a fault 810A has been introduced along an intermediate channel 812A between the second output of the second XOR gate 804A and the second input of the third XOR gate 806A. The fault 810A comprises a "stuck-at-1" fault, wherein the value of the second input of the third XOR gate 806A is "stuck" at 1 regardless of a value of the second output of the second XOR gate 804A. The fault 810A comprises a physical defect in the physical system architecture 800A, and may be captured in the RTL design by updating the HLD code. Note that this is the effect of the instrumentation of the HLD code, and the injection of the control vector into the RTL design to alter a segment of the HDL code. The RTL design, once altered, is then simulated to provide the outputs of column out2. In this manner faults may be introduced in the HLD code comprising the RTL design of the physical system architecture 800A.

The test suite comprising vector1-vector16 is exhaustive, and comprises a set of properties that can be simulated against the RTL design, or tested against a synthesized design. Thus, simulating vector1-vector16 against the RTL design comprises a complete set of properties because outputs of the RTL have been tested over all possible input conditions. Moreover, the synthesized design may also be completely verified against vector1-vector16, either by directly testing vector1-vector16 or through mathematical proof in this simplified example. However, testing the physical system architecture against all possible test vector combinations would prove computationally impractical if not impossible for most ASIC applications comprising greater than approximately $10^6$ gates. Moreover, a mathematic proof of the properties comprising exercising vector1-vector16 on a Boolean representation of the RTL design would occur on a representation of the RTL design, rather than the RTL design itself, wherein some structural information about the design is be lost during mathematical reduction. So while all possible inputs of the properties are proved, not all possible structural features are included in the representation of the RTL design.

FIG. 8B illustrates some embodiments of a synthesized Boolean logic representation 800B of the RTL design (i.e., the physical system architecture 800A). A simple example of a mathematical technique to reduce the size of the RTL design using logical equivalence techniques comprises reducing the physical system architecture 800A of the 4-to-1 XOR tree coupled to an inverter to a 4-input XNOR. This simplified example is utilized in the embodiments of the Boolean logic representation 800B to illustrate that structural information about the intermediate channel 812A, inverter 808*a*, and other intermediate channels have been lost in this representation. Therefore, a mathematical proof of the properties on this (i.e., reduced) Boolean logic representation 800B of the RTL design will not comprise any structural information about the intermediate channel 812A where a manufacturing defect modeled by the fault 810A occurs. For the embodiments of the FIG. 8B, the out1 column of the table of FIG. 8C comprises the outputs of the mathematical proof of properties of the (defect-free) Boolean logic representation 800B of the physical system architecture 800A.

For some physical system architecture embodiments it may be possible to simulate every possible input sequence. However, there may be logic in the design which cannot be stimulated, either because it is redundant, and therefore does not contribute to the overall function and could be removed, or because it was misconnected in some way, and although you have stimulated the logic around it, the input sequence of vectors was not good enough to propagate the failure caused to somewhere where it could be observed. Therefore, when looking at an RTL representation of a physical system architecture, this method allows one to know which lines of the RTL design have been executed, in order to search for redundant code, or code which should have been stimulated and was not executed.

It will be appreciated that equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A method to determine test coverage of a design, comprising:
    defining a hardware description language (HDL) system architecture within an HDL interface configured to define HDL code, wherein the HDL system architecture comprises a control vector further comprising a binary vector;
    modifying a component of the HDL system architecture with the HDL interface by operating on the HDL system architecture with the control vector;
    simulating a functionality of the HDL system architecture with a simulator using a test case of a plurality of test cases to determine if a modification of the component is detected; and
    verifying a physical system architecture synthesized from the HDL system architecture within a verification tool to determine if the modification of the component is detected.

2. The method of claim 1, wherein the modifying of the component of the HDL system architecture comprises modifying a segment of the HDL code with the control vector.

3. The method of claim 2, wherein the HDL system architecture further comprises a register transfer level (RTL) abstraction of an application-specific integrated circuit (ASIC).

4. The method of claim 3, wherein the verifying of the physical system architecture within the verification tool further comprises testing the physical system architecture with one or more test vectors to determine if the modification of the component is detected.

5. The method of claim 4, wherein the verifying of the physical system architecture within the verification tool further comprises:

defining the physical system architecture further comprising a Boolean logic representation of the design;
reducing the Boolean logic representation of the design through mathematical equivalencies;
mathematically proving that a property holds for the Boolean logic representation of the design; and
wherein mathematically proving that the property holds is equivalent to simulating all possible test vector combinations on the Boolean logic representation of the design.

6. The method of claim 5, further comprising comparing results of the simulating of the functionality of the HDL system architecture to results of the verifying of the physical system architecture to determine if the modification of the component is detected by verifying the physical system architecture.

7. The method of claim 6, wherein the control vector comprises a number of bits that is equal to a number of components of the RTL abstraction of the design, wherein the bits of the control vector are configured to be modified such that a bit value of zero leaves a corresponding component unaffected, and a bit value of non-zero modifies the corresponding component.

8. The method of claim 7, wherein a respective component of the components comprises one or more devices, or a portion of a device.

9. The method of claim 8, further comprising modifying the component of the design by introducing a fault into the component, wherein the fault models an effect of a manufacturing defect to the component, and wherein the effect on the manufacturing defect on the component is to produce an output that is not anticipated from an input.

10. The method of claim 7, wherein the control vector further configured to identify a sub-module of the design comprising one or more components, and to identify each component within the sub-module.

11. The method of claim 10, further comprising:
iteratively modifying each component of the RTL abstraction of the design one at a time, leaving remaining components unmodified;
synthesizing the RTL abstraction of the design into a plurality of Boolean logic representations of the design, one for each modified component;
mathematically proving that a set of properties hold for each Boolean logic representation of the design; and
comparing results of a simulation to results of a mathematical proof for each Boolean logic representation of the design to determine which component modifications are not detected by the mathematical proof to further determine which components of the RTL abstraction of the design are not covered in a verification.

12. The method of claim 11, further comprising refining the plurality of test cases to apply to components of the RTL abstraction of the design that are not covered in the verification.

13. A method to determine test coverage of a design, comprising:
constructing an abstract representation of the design comprising software code, further within a software code interface, wherein the abstract representation of the design comprises a first feature configured to modify each component of the abstract representation of the design;
modifying a component of the abstract representation of the design with the first feature within the software code interface;
simulating a function of the abstract representation of the design with one or more test stimuli of a plurality of test stimuli within a simulator to determine if a modification of the component is detected by a simulation;
synthesizing the abstract representation of the design into a physical representation of the design within a verification tool;
verifying a function of the physical representation of the design within the verification tool to determine if a modification of the component is detected by a verification; and
comparing results of the simulation to results of the verification to determine if the modification of the component is detected by the verification.

14. The method of claim 13, wherein the verifying of the function of the physical representation of the design further comprises mathematically proving that a set of properties hold for the physical representation of the design.

15. The method of claim 14, further comprising constructing the abstract representation of the design comprising a second feature configured to identify one or more sub-groupings of the abstract representation of the design, wherein a sub-grouping comprises one or more components of the design.

16. The method of claim 15, further comprising:
iteratively modifying each component of the abstract representation of the design one at a time, leaving remaining components unmodified;
simulating the abstract representation of the design after the component is modified to determine if the modification is determined by a simulation;
synthesizing the abstract representation of the design into a plurality of physical representations of the design, one for each modified component;
mathematically proving that the set of properties hold for each physical representation of the design; and
comparing results of the simulation to results of a mathematical proof for each physical representation of the design to determine which component modifications are not detected by the mathematical proof to determine which components of the abstract representation of the design are not covered in the verification.

17. The method of claim 16, further comprising refining the plurality of test stimuli to apply to components of the abstract representation of the design that are not covered in the verification.

18. A processing unit configured to determine test coverage of a design, comprising:
hardware description language (HDL) interface configured to define a processor system architecture as a register transfer level (RTL) abstraction of the design comprising a number of components;
a test bench configured to define a plurality of test cases configured to test a functionality of the RTL abstraction of the design;
a simulator configured to simulate the plurality of test cases against the RTL abstraction of the design; and
an instrumentation tool configured to modify the RTL abstraction of the design by augmenting the RTL abstraction of the design such that a control vector can be injected into the RTL abstraction of the design, wherein the control vector is configured to modify components of the RTL abstraction of the design and comprises a binary vector comprising a number of bits that equals the number of components and configured to be modified such that, for a respective bit, a bit value of zero leaves a corresponding component unaffected, and a bit value of non-zero modifies the corresponding component.

19. The processing unit of claim 18, further comprising a formal verification tool configured to:
synthesize the RTL abstraction of the design into a physical representation of the design comprising a Boolean logic representation of the design;
reduce the Boolean logic representation of the design through mathematical equivalencies; and
mathematically prove that a property holds for the Boolean logic representation of the design.

20. The processing unit of claim 19, further comprising a comparator configured to compare results of the simulator to a mathematical proof of the formal verification tool to determine if a modification to the RTL abstraction of the design is detected by the mathematical proof on the Boolean logic representation of the design.

* * * * *